United States Patent
Tucker et al.

(10) Patent No.: US 7,132,849 B2
(45) Date of Patent: Nov. 7, 2006

(54) METHOD AND APPARATUS FOR CONFIGURING THE OPERATION OF AN INTEGRATED CIRCUIT

(75) Inventors: John Tucker, Austin, TX (US); Ram Krishnamurthy, Austin, TX (US); John James Paulos, Austin, TX (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 209 days.

(21) Appl. No.: 10/852,586

(22) Filed: May 24, 2004

(65) Prior Publication Data
US 2006/0152246 A1   Jul. 13, 2006

(51) Int. Cl.
 *G06F 7/38* (2006.01)
 *G06F 17/50* (2006.01)
 *H03K 19/173* (2006.01)
 *H03K 19/00* (2006.01)

(52) U.S. Cl. .......................... 326/38; 326/37; 326/101; 716/17

(58) Field of Classification Search ............ 326/37–38, 326/101; 716/17
See application file for complete search history.

(56) References Cited

U.S. PATENT DOCUMENTS

| | | | | |
|---|---|---|---|---|
| 5,477,166 A | * | 12/1995 | Matthews | .................... 326/38 |
| 5,511,182 A | * | 4/1996 | Le et al. | .................... 713/600 |
| 6,327,632 B1 | * | 12/2001 | Sollars | ........................ 710/10 |

* cited by examiner

*Primary Examiner*—Rexford Barnie
*Assistant Examiner*—Jason Crawford
(74) *Attorney, Agent, or Firm*—Christie, Parker & Hale, LLP (57) ABSTRACT

Method and apparatus for configuring the operation of an integrated circuit. An integrated circuit with external programming capabilities is disclosed. A pin current source is provided for interfacing with at least one pin on the integrated circuit to control current flow there through to an external load interfaced to the at least one pin external to the integrated circuit. The external load has at least two discrete values. A voltage detector detects the voltage on the at least one pin and a state detector then compares the voltage on the at least one pin to at least two discrete voltage thresholds. Each of the discrete voltages is associated with a separate value of a control word, and the state detector is operable to determine the value of the control word associated with the detected voltage. The state detector then outputs the determined value of the control word.

35 Claims, 6 Drawing Sheets

METHOD AND APPARATUS FOR CONFIGURING THE OPERATION OF AN INTEGRATED CIRCUIT

TECHNICAL FIELD OF THE INVENTION

This invention pertains in general to configuring the operation of an integrated circuit and, more particularly, to the use of programmable input pins for providing configuration instructions to an integrated circuit.

CROSS-REFERENCE TO RELATED APPLICATIONS

None

BACKGROUND OF THE INVENTION

Integrated circuits (ICs) have become more complex in their operation and the overall functionality associated therewith to allow the IC to function in more than one application. In order to increase the versatility of an integrated circuit even for a single application, a manufacturer will typically provide a large amount of flexibility of the functionality on-chip. By setting certain parameters in various configuration registers, the nature of the chip and the operating parameters thereof can be altered for a given application. Thus, when an integrated circuit is designed into an application, there will be some type of configuration information loaded onto the chip. In some situations, there can be on-board non-volatile memory such as EEPROM that can be semi-permanently programmed, such that, upon power-up, the chip will load its configuration information into active memory. Alternatively, an external memory can be provided for containing configuration information which can then be uploaded to the IC. In some situations, there is insufficient non-volatile memory on-chip for this purpose and, as such, the configuration registers must be loaded from external memory. This, of course, requires an external memory.

Another technique for configuring the operation of an integrated circuit is to provide external program pins. By connecting a pin to either a positive voltage or to ground, two states of programmability can be provided for each pin. However, as one would anticipate, this requires a large number of pins for a large number of configuration possibilities. There have been a number techniques provided for programming a dedicated pin to establish multiple states. One such techniques is connecting the pin to a positive voltage, to a negative voltage or maintained in an open circuit state to provide the programmability, with the connections to the positive and negative voltage being through a resistor or hard connected. However, the number of program states for each pin is limited.

SUMMARY OF THE INVENTION

The present invention disclosed and claimed herein, in one aspect thereof, comprises an integrated circuit with external programming capabilities. A pin current source is provided for interfacing with at least one pin on the integrated circuit to control current flow there through to an external load interfaced to the at least one pin external to the integrated circuit. The external load has at least two discrete values. A voltage detector detects the voltage on the at least one pin and a state detector then compares the voltage on the at least one pin to at least two discrete voltage thresholds. Each of the discrete voltages is associated with a separate value of a control word, and the state detector is operable to determine the value of the control word associated with the detected voltage. The state detector then outputs the determined value of the control word.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
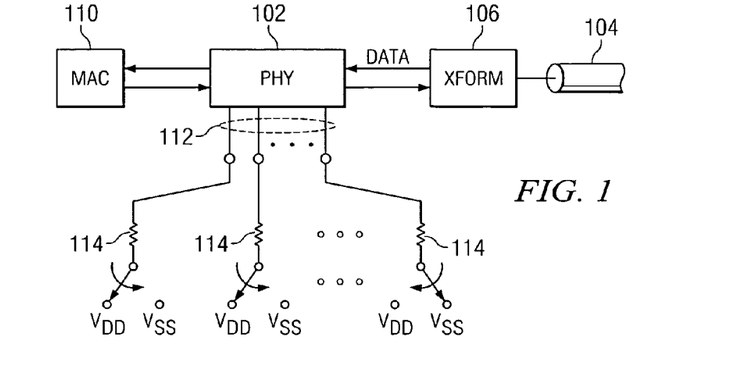
FIG. 1 illustrates an overall block diagram of an integrated circuit application with the programmable input pin.

Referring now to FIG. 1, there is illustrated a block diagram of an application of an integrated circuit utilizing external programmable pins. In this application, there is illustrated a physical layer device (PHY) 102 which is a device utilized in a network interface application. These are conventional devices. They are fairly complex devices that operate with digital processing circuitry, analog-to-digital data converters and digital-to-analog converters. The PHY 102 is operable to interface with a transmission cable 104 through a transformer 106 to allow data to be transferred therebetween in accordance with a conventional protocol. The cable interface is termed an RJ45 interface, but there could be an optical interface using a serial data transfer protocol referred to as SERDES. The PHY 102 is operable to receive data, decode it and then convert it to a format for transmission on a media side to a media access controller (MAC) 110 for data transfer in one direction, and also provide for data transfer in the opposite direction. This allows data to be transferred therebetween in addition to timing information. There is typically a defined data transfer format on the media side, one being the GMII data format. This, again, is conventional.

The PHY 102 can operate in many different environments and design applications. Each of these applications requires the operation of the PHY 102 to be specifically configured for the application. This allows the PHY 102 to be formatted in many different configurations to set various oscillator frequencies, media output formats, etc. It should be understood that the PHY 102 is but an example of an application of an IC that would require configuration, and is not intended to be limiting.

In the present disclosure, configuration of the IC is facilitated with a plurality of dedicated configuration pins 112, there being eight in the disclosed embodiment. Each of these pins is connected through an associated external program resistor 114 to either the supply voltage, $V_{DD}$, or the ground reference voltage at $V_{SS}$. Each of the external program resistors 114 has eight discrete values, such that there are eight discrete states when connected to $V_{DD}$ and eight discrete states when connected to $V_{SS}$. This provides for sixteen discrete programmable states for each pin, there being eight pins to provide a fairly large configuration word.

Figures 2, 3A, 3B:
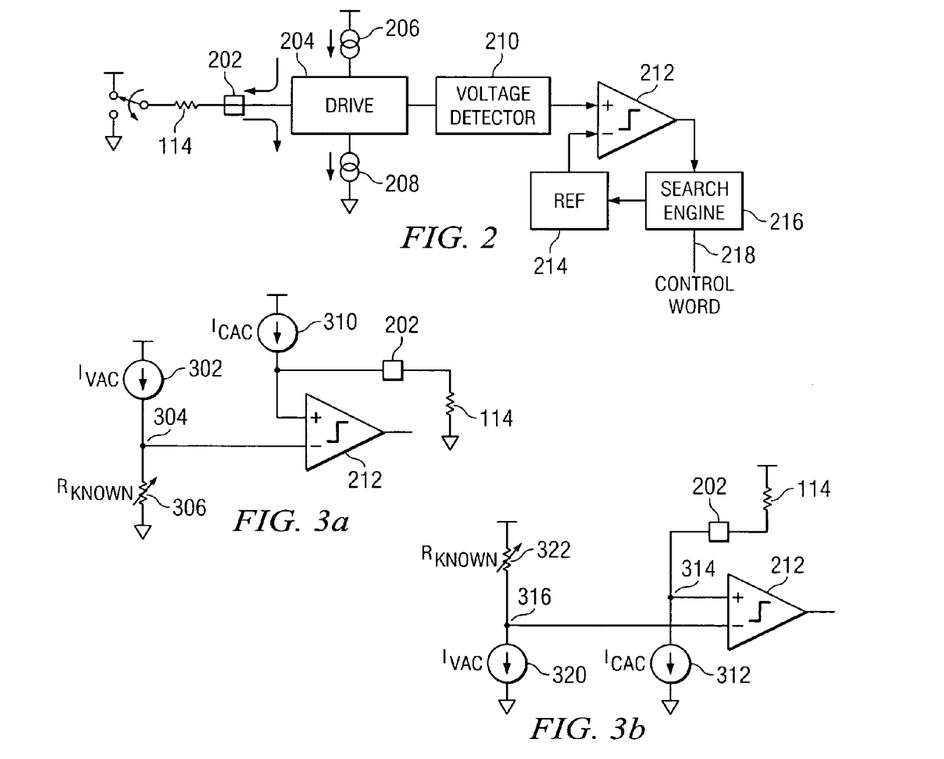
FIG. 2 illustrates a diagrammatic view of the circuitry associated with the single programming pin.
FIGS. 3a and 3b illustrate a detail of the external program resistor connection to ground and the external program resistor connection to the power supply terminal, respectively.

Referring now to FIG. 2, there is illustrated a diagrammatic view of the decode circuitry for each of the pins. Associated with each of the pins on the integrated circuit that is capable of being programmed is a pad 202, which pad 202 has one of the external program resistors 114 associated therewith connected through a representative switch (which is a fixed connection in actual application) connected to either $V_{DD}$ or $V_{SS}$. There is provided a drive circuit 204 which is operable to interface with a current source 206 to source current to the pad 202 and through external program resistor 114 when connected to $V_{SS}$, and a current sink 208 which is operable to sink current from the pad 202 when the external program resistor 114 is connected to $V_{DD}$. As will be described herein below, the drive circuit 204 is operable in a first detect mode to detect the voltage on the pad 202 with no current flowing through the pad 202. In this manner, if the external program resistor 114 is connected to ground or $V_{SS}$, the voltage on pad 202 will be low, and if the external program resistor 114 is connected to $V_{DD}$, the voltage on pad 202 will be high. In an alternate embodiment, the detect operation is operable to first connect the current source 206 to pad 202 in order to determine whether the external program resistor 114 is connected to $V_{DD}$ or $V_{SS}$. In this mode, if the external program resistor 114 is connected to $V_{SS}$, then the voltage on pad 202 will drop. If external program resistor 114 is connected to $V_{DD}$, then there will be no drop in the voltage. A voltage detector 210 is provided to detect the voltage on the pad 202. Therefore, the first step in the operation is to determine which power supply terminal the resistor is connected to. After such first detect operation, then the drive circuit 204 is disposed in a second mode of operation where a correlation is made between the discrete value of the external program resistor 114 and a digital value by sourcing current to or sinking current from external program resistor 114.

The voltage detector 210 is input to one end of a comparator 212, the other input thereof connected to a reference voltage 214 that is correlated to the possible discrete values of the external program resistor 114. This reference voltage 214, as will be described herein below, is generated utilizing a variable internal resistor and an internal known current source. The reference voltage 214 is varied with a search engine 216 which is operable to determine what reference voltage is required to be disposed on the reference input of the comparator 212 in order to determine the resistor value of external program resistor 114 and the resulting program state, i.e., the two voltages are matched, the known voltage generated with the internal variable resistor and the measured voltage with the external program resistor 114. This will result in a control word being output by the search engine 216 on a bus 218, which will be stored in a control register utilized for the configuration of the integrated circuit, i.e., the PHY 102 in the application illustrated in FIG. 1.

Referring now to FIG. 3a, there is illustrated a block diagram for the operation wherein the external program resistor 114 is connected to $V_{SS}$, that can provide up to eight discrete program values. An internally generated voltage accurate current source $I_{VAC}$ 302 is provided for sourcing current from a power supply voltage such as $V_{DD}$ to a node 304. A known variable resistor 306 is provided that is connected between node 304 and ground or $V_{SS}$. This resistor 306 is an internal resistor that is fabricated on the integrated circuit. Typically, this will be fabricated as a polycrystalline silicon resistor. This resistor has known characteristics and a known design value, but due to manufacturing variations and the such, this resistor can vary in its actual value from the design value. Additionally, over temperature, the polycrystalline silicon resistor varies in value with a known temperature variation.

The resistor 306 is varied by adding discrete resistors in series with or in parallel thereto, these resistors being fabricated on-chip. As will be described herein below, the specific embodiment disclosed herein utilizes a resistor ladder of identical resistors which is selectively "tapped." However, any method for varying the resistor value in a known and discrete manner can be utilized. With the use of the voltage accurate current source 302, the voltage at the node 304 will be known as a function of the value of the resistor 306, and the voltage accurate current source 302 will compensate for variations in the resistor due to process variations or temperature variations, while maintaining an accurate voltage across the resistor 306.

The node 304 is connected to the negative input of the comparator 212. The positive input of the comparator 212, as described herein above, is connected to the pad 202. A current accurate current source 310 is operable to provide a current accurate current $I_{CAC}$, which provides a current source that is substantially independent of temperature variations, process variations and voltage fluctuations. This current accurate current is provided to the pad 202 to drive the external program resistor 114 for sourcing current thereto, since the external program resistor 114 is connected to ground. This current sourced to the pad 202 is accurate, as it is referenced to a band gap reference circuit fabricated internal to the integrated circuit and to an off-chip reference resistor. The band gap reference is a well known and conventional circuit that provides a temperature and process independent voltage. This voltage, together with the off-chip reference resistor, is used to generate a current which will be accurate and the voltage to the negative input of the comparator 212 will be accurate and a function of substantially only the value of the external program resistor 114. This provides a fixed program voltage on the positive input of the comparator 212, wherein the resistor 306 will vary the voltage on the node 304 as a function of the resistance value thereof. Thus, discrete levels of resistance variation in the resistor 306 will result in discrete steps in the voltage on the node 304, which will match the discrete steps of voltage on pad 202 due primarily to the different values of the external program resistor 114. These external program resistor values can be varied in accordance with the following resistor table:

| Ext Pgm Resistor | Value | $V_{SS}$ | $V_{DD}$ |
|---|---|---|---|
| 0) | 0 | 0001 | 1000 |
| 1) | 2.26k | 0010 | 1001 |
| 2) | 4.02k | 0011 | 1010 |
| 3) | 5.90k | 0100 | 1011 |
| 4) | 8.25k | 0101 | 1100 |
| 5) | 12.1k | 0110 | 1101 |
| 6) | 16.9k | 0111 | 1110 |
| 7) | 22.6k | 1000 | 1111 |

Referring now to FIG. 3b, there is illustrated a diagram of the alternate configuration wherein the external program resistor 114 is connected to $V_{DD}$. In this configuration, a different voltage accurate current source and a different current accurate current source are provided. In this configuration, the external program resistor 114 is connected between $V_{DD}$ and the pad and, therefore, current must be sinked therefrom. To provide for this, a current accurate current source 312 is provided with the current, $I_{CAC}$, sinked from the pad 202 to ground or $V_{SS}$ through the external program resistor 114. Pad 202 and one side of the current source 312 are connected to a node 314, this connected to the positive input of the comparator 212. The negative node of the comparator 212 is connected to a node 316, which has a voltage accurate current source 320 connected from there to ground, such that current is sinked from the node 316. A variable internal resistor 322 is connected between $V_{DD}$ and the node 316. This resistor 322 is similar to the resistor 306 in that it is variable in discrete steps. In general, the embodiment of FIG. 3b operates substantially identical to the embodiment of FIG. 3a with the exception of the direction Of current.

In operation, the comparison procedure for the comparator 212 is to provide on the node 304 (for the program resistor 114 connected to ground) in quantized steps of voltage that will be different than the exact voltage associated with that on the positive input of the comparator 212 on the pad 202. For the program resistor 114 connected to $V_{DD}$, the same operation will be performed in that the voltage is changed in quantized steps. In order to do this, a different resistor value for each state will be provided for the value of resistor 306 when testing a program resistor connected to ground, and a different resistor value for each state will be provided for the value of resistor 322 when testing a program resistor connected to $V_{DD}$. For the program resistor 114 connected to ground, a voltage will be disposed on the node 304 that is lower than the voltage on the positive input of the comparator 212. If the comparator 212 determines that the voltage on the positive input of the comparator 212 is higher than the voltage on node 304, this will indicate that the program resistor value is above the known resistor value of resistor 306. The following quantization table illustrates these values for resistor 306 and resistor 322:

QUANTIZATION TABLE

| TO $V_{SS}$ | > | TO $V_{DD}$ | < |
|---|---|---|---|
| 1667 | 0010 | 1667 | 1001 |
| 3334 | 0011 | 3334 | 1010 |
| 5000 | 0100 | 5000 | 1011 |
| 6876 | 0101 | 6876 | 1100 |
| 10,626 | 0110 | 10,626 | 1101 |
| 14,376 | 0111 | 14,376 | 1110 |
| 19,376 | 1000 | 19,376 | 1111 |

It can be seen from looking at the Quantization Table that, for testing a program resistor 114 connected to $V_{SS}$ or ground, a test value greater than the resulting voltage on the negative input to the comparator 212 will result in a determination that the program resistor value is higher than that of the known resistor value. For example, if the value of resistor 306 is a value of 1,667 Ohms, then this indicates that the value of program resistor 114 is 2.26 k Ohms. Similarly, the next value of resistor 306 will be 3,334 Ohms and, if the comparator 212 determines that the voltage is less than the voltage on the positive input of comparator 212 is less than the voltage on node 304, this indicates that the program resistor value is 2.26K Ohms, i.e., that associated with the code "0010," and if the output of comparator 212 indicates that the voltage on node 304 is less than the value of the voltage on the pad 202, the positive input of comparator 212, this indicates that the value of the resistor 114 is 4.02K Ohms. By sizing the variable resistors 306 and 322 to a value less than the program resistor value, the comparator 212 can quantize the testing operation.

Figure 4A:
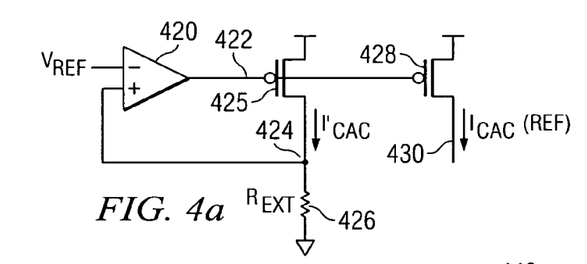
FIGS. 4a–4c illustrate schematic diagrams of the circuits for generating the basic current accurate current and voltage accurate current reference currents.
Figure 4B:
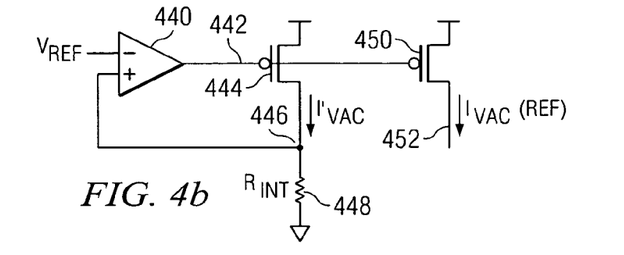
Figure 4C:
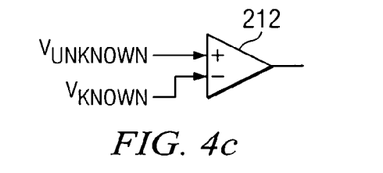

Referring now to FIGS. 4a–4c, the operation and benefits of utilizing the current accurate current and voltage accurate current will be described. With specific reference to FIG. 4a, there is illustrated a schematic diagram of the circuitry for generating the current accurate current which provides a reference current accurate current, as will be utilized herein below, and which is mirrored to sink or source current. A voltage reference is generated, $V_{REF}$. In the disclosed embodiment, this reference voltage is generated on-chip with a band gap generator, a well known type of voltage generator. This provides the band gap generator voltage, $V_{BG}$. This voltage $V_{BG}$ is a reference voltage that is temperature and process invariant, i.e., it provides a very stable voltage over temperature. However, it should be understood that any reference voltage can be utilized, as the determination of the unknown resistor is insensitive to variations in this voltage, as will be shown below.

The voltage $V_{REF}$ is input to the negative input to the negative input of an operational amplifier 420, the output thereof connected to a node 422, which node 422 drives the gate of a p-channel transistor 425. The p-channel transistor 425 has the source/drain path thereof connected between $V_{DD}$ and a node 424. Node 424 is connected to the positive input of operational amplifier 420. Node 424 is also connected to one side if an external resistor, $R_{EXT}$, 426, the other side thereof connected to ground. The external resistor 426 is connected external to the integrated circuit to a pin thereon at node 424, the other side thereof connected to ground. This resistor 426 is a resistor selected by the user in the application and it is a resistor that has a known value to set the current there through. Thus, the voltage across resistor 426 is $V_{REF}$ at node 424 and the current through resistor 426 is $V_{REF}/R_{EXT}$. The node 422 is also connected to the gate of a p-channel transistor 428, which has the source connected to $V_{DD}$ and the drain connected to an output node 430 that provides the current $I_{CAC}$ which will be mirrored to source or sink current, as will be described herein below. The transistor 428 is sized relative to transistor 425 such that the voltage $I_{CAC}$ is ratioed to the current through resistor 426, $I'_{CAC}$, by a factor of K', i.e., $I_{CAC}=K'_{CAC}$ I'. This basically provides a current mirror of the current through resistor 426. It is noted, as will be described herein below, that the resistor $R_{EXT}$ is a known resistor that has a known temperature profile. It is a very tightly controlled resistor, as is the program resistor 114, $R_{PROG}$. The current $I_{CAC}$, or a mirrored version thereof will be driven through resistor 114 or sinked therefrom.

Referring now to FIG. 4b, there is illustrated a schematic diagram of the circuit for generating $I_{VAC}$. The reference voltage $V_{REF}$ is input to the negative input of an operational amplifier 440, the output thereof connected to a node 442. Node 442 drives the gate of p-channel transistor 444, the source/drain path thereof connected between $V_{DD}$ and a node 446. Node 446 is connected to the positive input of the operational amplifier 440 and also to one side of an internal resistor, $R_{INT}$, 448. Resistor 448 is a resistor formed on the substrate that is of substantially the same material as resistor 306, the variable resistor, $R_{KNOWN}$. As will be described herein below, the resistor 306 is formed of a plurality of resistors, each having a value of 2.5K Ohm. Thus, the temperature and process dependencies of the resistor 448 will "track" those of the resistor 306, as they are both fabricated on chip and of the same material, i.e., polycrystalline silicon. The voltage on the node 446 is substantially the voltage $V_{REF}$. As described herein above, this voltage is generated with a band gap generator. The output of operational amplifier 440 also drives the gate of a p-channel transistor 450, the source thereof connected to $V_{DD}$ and the drain thereof connected to a node 452 that provides the mirrored output current $I_{VAC}$, which current provides a reference current that will be mirrored to a sink current and a source current, as will be described herein below. The transistor 450 is sized with respect to the transistor 444 such that the current through transistor 450 is ratioed to the current through transistor 444, $I'_{VAC}$, by a factor K, i.e., $I_{VAC}=KI'_{VAC}$.

In order to describe the benefits and insensitivities of the two generated currents $I_{CAC}$ and $I_{VAC}$, FIG. 4c illustrates the comparator 212 with the positive and negative inputs connected to voltages labeled $V_{UNKNOWN}$ on the positive input thereof and a voltage $V_{KNOWN}$ on the negative input. The voltage $V_{UNKNOWN}$ is generated from the internal resistor $R_{KNOWN}$ and the voltage $V_{UNKNOWN}$ is generated from the external program resistor 114. The following two equations represent the relationship of the currents $I_{VAC}$ and $I_{CAC}$ to the respective resistors and the reference voltage $V_{REF}$:

$$I_{VAC} = \frac{V_{REF}}{R_{INT}} \cdot K$$

$$I_{CAC} = \frac{V_{REF}}{R_{EXT}} K'$$

The voltage $V_{UNKNOWN}$ and the voltage $V_{KNOWN}$ are defined by the following two equations:

$$V_{UNKNOWN}=I_{CAC} \cdot R_{PROG}$$

$$V_{KNOWN}=I_{VAC} \cdot R_{KNOWN}$$

When the resistor $R_{KNOWN}$ is varied such that there is an equality on the input to the comparator 212, $V_{UNKNOWN}$ will equal $V_{KNOWN}$ and the following equality will result:

$$I_{CAC} \cdot R_{PROG}=I_{VAC} \cdot R_{KNOWN}$$

Substituting the relationships of equations 1 and 2 for $I_{CAC}$ and $I_{VAC}$, respectively, the following equality results.

$$K' \frac{V_{REF}}{R_{EXT}} \cdot R_{PROG} = K \frac{V_{REF}}{R_{INT}} \cdot R_{KNOWN}$$

Since the voltage $V_{REF}$ cancels out on both sides of the equation, the resulting equality will be as follows:

$$K' \frac{R_{PROG}}{R_{EXT}} = K \frac{R_{KNOWN}}{R_{INT}}$$

It can be seen from a review of Equation 7 that the ratio of $R_{KNOWN}$ to $R_{INT}$ is a ratio that is temperature insensitive, since both resistors track in temperature and process dependence, since both are fabricated on chip and of the same material. Similarly, the resistors $R_{PROG}$ and $R_{EXT}$ have a constant ratio in that they are both known values and are very tightly controlled resistors, since they are both external resistors and have similar temperature dependencies. As such, the dependency on process is taken out of the internal resistors and the dependency on voltage is also taken out, such that there is a known voltage on the input to the comparator 212. The unknown voltage comes from known resistors with a known current there through, which resistors are tightly controlled.

Figure 5:
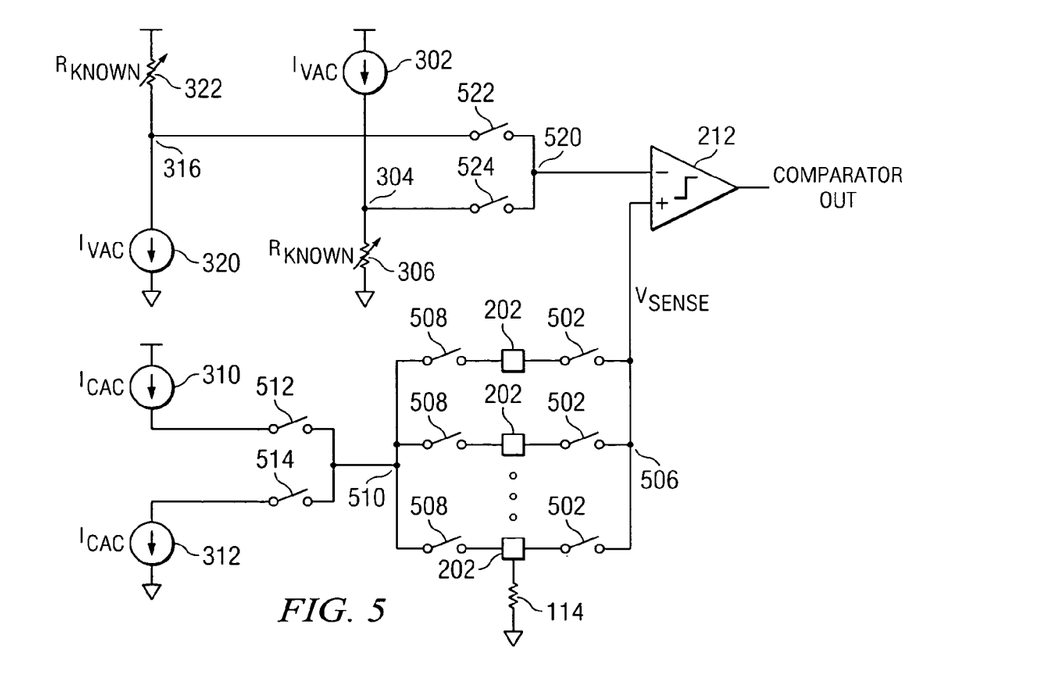
FIG. 5 illustrates a detail of the multiplexed operation for external multiple programming pins.

Referring now to FIG. 5, there is illustrated a block diagram for the multiplexed operation wherein the comparator 212 is multiplexed between all of the pads 202 and between the current sources for both connection configurations of the external program resistor 114. In this multiplexed configuration, each of the pads 202 has associated therewith a switch 502 connected between the pad 202 and a node 506, node 506 connected to the positive input of the comparator 212. The node 202 is also connected to one side of a switch 508, the other side thereof connected to a node 510. Node 510 is operable to be connected to the current accurate current source 310 or the current accurate current source 312. A switch 512 is connected between node 510 on one side of the current accurate current source 310 that sources current from $V_{DD}$. A switch 514 is connected between node 510 and one side of the current accurate current source 412, which current source sinks current to $V_{SS}$. Thus, the positive input of comparator 212 can either be connected to a current source or a current sink and one of the multiple pads 202 can be connected with the associated switches 508 and 502. There is illustrated a single external program resistor 114 disposed between one of the paths 102 and ground, it being recognized that each of the paths will have a separate external program resistor 114 connected to either $V_{DD}$ or $V_{SS}$, the pad 202 not being capable of being open circuited.

The negative input of the comparator 212 is connected to a node 520. Node 520 is connected through a switch 522 to the node 316 associated with the voltage accurate current source 320 and the resistor 322. A second switch 524 is operable to connect the node 520 to the node 304 associated with the voltage accurate current source 302 and the resistor 306. In operation, it can be seen that comparator 212 can be utilized first for the voltage detection operation utilized to determine which power supply the external program resistor 114 is connected to, wherein a median level voltage is set at either node 406 or node 304 to the negative input of comparator 212 and then the switches 512 and 514 opened. This will determine whether the external program resistor 414 is present and connected to ground or $V_{DD}$.

Figure 6:
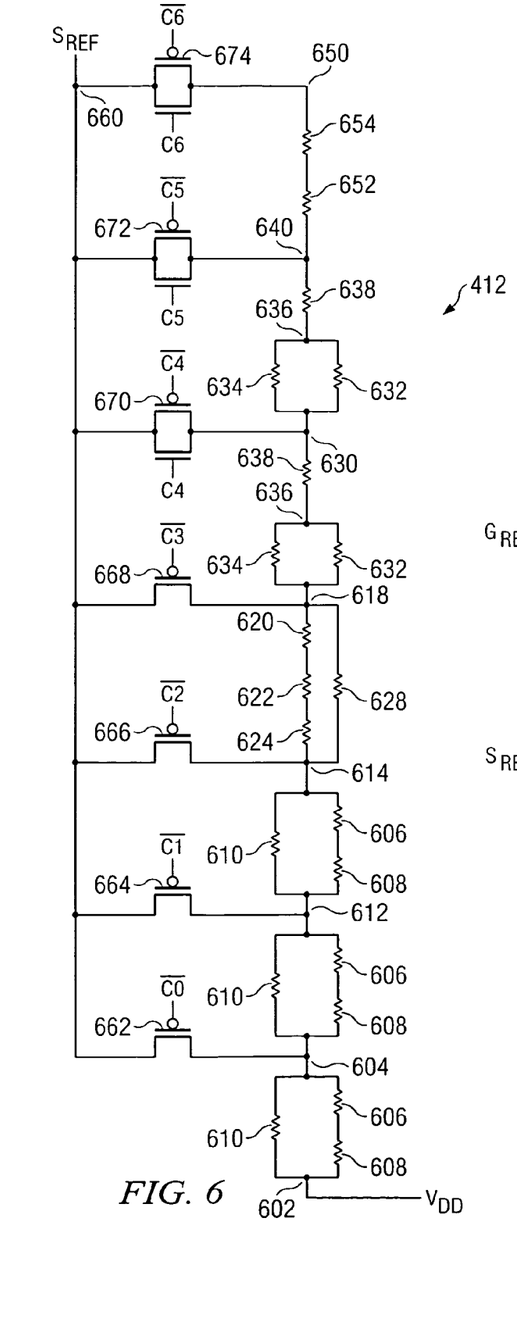
FIG. 6 illustrates the ladder network for the variable internal resistor for one orientation.

Referring now to FIG. 6, there is illustrated a schematic diagram of one of the internal resistors 322 and 306, this being the resistor 322 that is connected on one side to $V_{DD}$. However, as will be described herein below, these two resistors are identical, they each being comprised of a ladder network. The resistor 322 on one side thereof is connected to $V_{DD}$ at a node 602. There is a resistive network disposed between node 602 and a tap node 604. This is comprised of three resistors, two series connected resistors 606 and 608 connected between the node 604 and 602 and a parallel resistor connected between node 602 and 604. These resistors are all the same size, 2.5K in this disclosure. Node 604 is connected to one side of a second resistive network, the other side thereof connected to a tap node 612. This second resistive network is substantially identical to the resistor network disposed between the nodes 602 and 604, and is comprised of resistors 606, 608 and 610. Another identical resistor network comprised of the resistors 606, 608 and 610 is connected between node 612 and another tap node 614. Node 614 is connected through a resistive network to a tap node 618 through a resistive network comprised of three series connected resistors 620, 622 and 624 with a parallel resistor 628 connected between node 614 and 618, all of these resistors being identical, 2.5K resistors. A resistive network is disposed between node 618 and a tap node 630 comprised of two parallel resistors 632 and 634 connected between node 618 and intermediate node 636, intermediate node 636 connected through a resistor 638 to node 630. Each of the resistors 632, 634 and 638 are 2.5K resistors. An identical resistive structure is connected between the node 630 and a tap node 640 comprised of the resistors 632, 634 and 638. Node 640 is connected to a node 650 through two series connected resistors 652 and 654, which are both 2.5K resistors. The resistive structure of the ladder network of FIG. 6 is configured such that common value resistors can be utilized. However, each resistive structure between the various tap nodes could be specifically designed for that resistive value. The result is that the resistive value between nodes 602 and 604, 604 and 612 and 612 and 614 have a value of 1.667K. The resistive structure between nodes 614 and 618 has a resistive value of 1.875K. The resistive structure between nodes 618 and 630 and nodes 630 and 640 has a resistive value of 3.75K. The resistive structure between nodes 640 and 650 has a resistive value of 5K.

Node 604 is connected to a source reference node 660 through the source/drain path of a p-channel transistor 662. Similarly, nodes 612, 614 and 618 are connected through the source/drain paths of respective p-channel transistors 664, 666 and 668 to the node 660. Nodes 630, 640 and 650 are connected to node 660 through gates 670, 672 and 674, all of which are configured with two parallel connected p- and n-channel transistors to form a gate. The reason that the gate comprised of p- and n-channel transistors is not required for nodes 604, 612, 614 and 618 is that the voltage will be sufficiently high enough that an n-channel transistor is not required to provide a pass-through of the current there through. As such, current can be passed from node 602 through the various resistors and the appropriately turned on gate to the node 660 during operation thereof.

The resistor 306 is identical to the resistive ladder structure of FIG. 6 with the exception that the node 602 is connected to $V_{SS}$ and the transistors associated with gates 662, 664, 666 and 668 are n-channel transistors. Other than that, the structure is identical. Additionally, in the resistor 322 of FIG. 6, the gates of transistors 662, 664, 666 and 668 are connected to control signal C0-Bar, C1-Bar, C2-Bar and C3-Bar, respectively. The gates of the n-channel transistors for the pass gates 670, 672 and 660 are connected to C4, C5 and C6, with the complementary p-channel transistors associated therewith connected to the inverse gate control signal. For the resistor 306 (not shown), the n-channel transistors that replace the p-channel transistors 662, 664, 666 and 668 have the non-inverted form of the control gate connected thereto.

Figure 7:
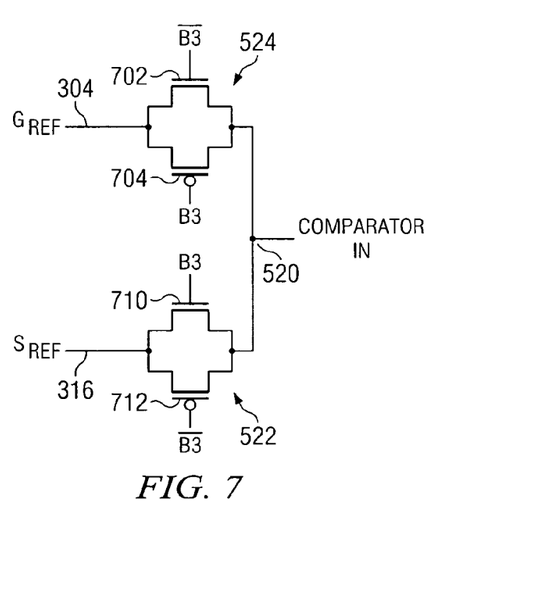
FIG. 7 illustrates a schematic diagram for the enable switches.

Referring now to FIG. 7, there is illustrated a schematic diagram of the switches 522 and 524. The switches 524 and 522 are configured of two parallel connected complementary—and p-channel transistors. An n-channel transistor 702 has the source/drain path thereof connected between the node 304 and the node 520 and the source/drain path of a p-channel transistor 704 connected between node 304 and 520, the gate of transistor 704 connected to the control signal b3 and the gate of transistor 702 connected to the control signal b3-Bar. The switch 522 is comprised of an n-channel transistor 710 and the p-channel transistor 712 having the source/drain path thereof connected in parallel between nodes 316 and 520. The gate of transistor 710 is connected to the control signal b3 and the gate of p-channel transistor 712 is connected to the signal b3-Bar.

Figure 8:
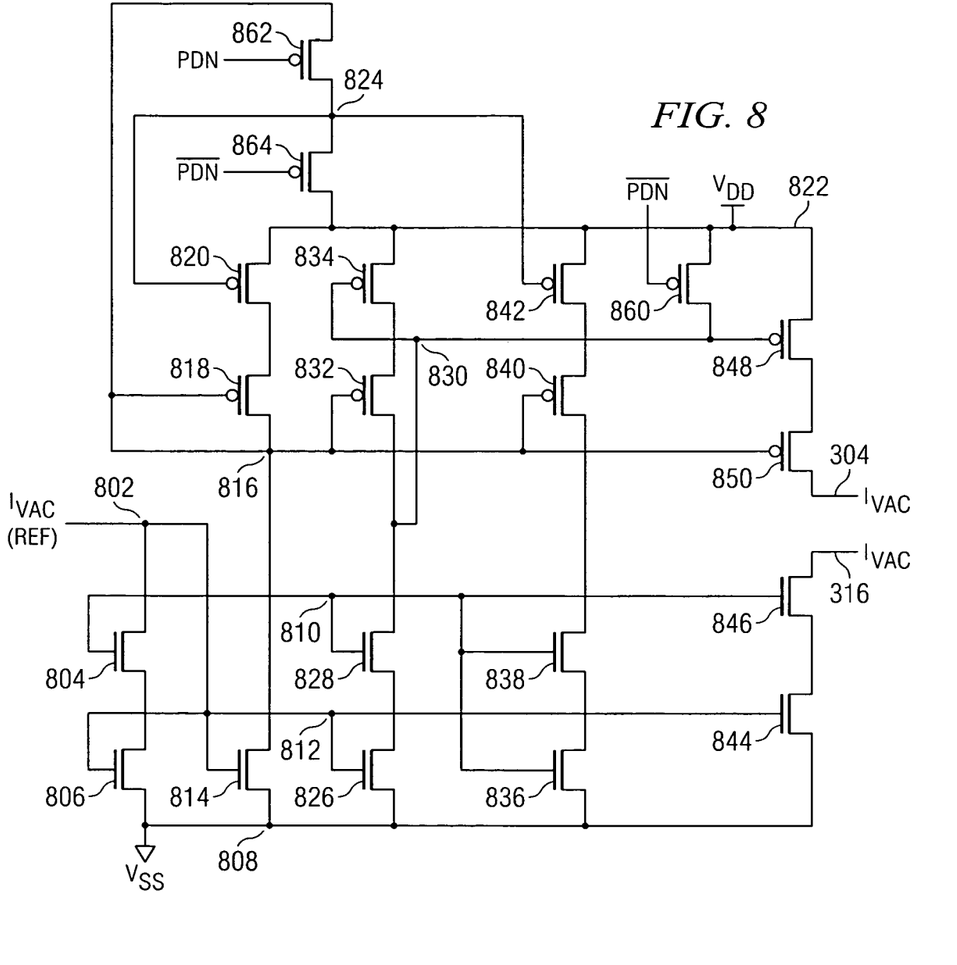
FIG. 8 illustrates a schematic diagram for the voltage accurate current mirror circuit.

Referring now to FIG. 8, there is illustrated a schematic diagram of a current source circuit used in the voltage accurate current source 302 and the voltage accurate current source 320. A reference voltage accurate current source is received on a node 802 from the node 452 of the current source of FIG. 4b for mirroring thereof. Node 802 is connected to one side of an n-channel transistor 804, the other side thereof connected to one side of an n-channel transistor 806, the other side there of connected to $V_{SS}$ on a node 808. (It will be noted herein that the sides of a transistor, whether it is a p-channel transistor or an n-channel transistor, refer to either side of the source/drain path thereof.) The gate of transistor 804 is connected to a node 810 and the gate of transistor 806 is connected to a node 812. The current through transistors 804 and 806 is, for description herein, normalized to a value of "1." An n-channel transistor 814 is connected between the $V_{SS}$ node 808 and a node 816. Node 816 is connected to one side of a p-channel transistor 818, the other side thereof connected to one side of a p-channel transistor 820, the other side thereof connected to a $V_{DD}$ node 822. The gate of transistor 818 is connected to node 816 and the gate of transistor 820 is connected to a node 824. The current through transistor 814 is twice the current through transistor 806, as the size of transistor 814 is twice the size of transistor 806.

An n-channel transistor 826 has one side thereof connected to node 808 and the other side thereof connected to one side of an n-channel transistor 828, the other side thereof connected to a node 830. Node 830 is connected to one side of a p-channel transistor 832, the other side thereof connected to one side of p-channel transistor 834, the other side of transistor 834 connected to the $V_{DD}$ node 822. The gate of transistor 826 is connected to node 812, the gate of transistor 828 is connected to node 810, the gate of transistor 832 is connected to node 816 and the gate of transistor 834 is connected to node 830. The current through transistor 826 is the same as the current through transistor 806.

An n-channel transistor 836 has one side thereof connected to node 808 and the other side thereof connected to one side of an n-channel transistor 838, the other side of transistor 838 connected to one side of a p-channel transistor 840, the other side of p-channel transistor 840 connected to one side of a p-channel transistor 842, and the other side of p-channel transistor 842 connected to the $V_{DD}$ node 822. The gates of transistors 836 and 838 are connected to node 810, the gate of transistor 840 is connected to node 816 and the gate of transistor 842 is connected to node 824. Two cascode n-channel transistors 844 and 846 are connected in series with the one side of transistor 844 connected to node 808 and the other side of transistor 846 is connected to node 316 to provide the output current for the voltage accurate current source 320. The gate of transistor 844 is connected to node 812 and the gate of transistor 846 is connected to node 810. Similarly, the output of the current source 302 is provided by two series connected cascode p-channel transistors 848 and 850 connected in series between node 822 and node 304, with the gate of transistor 848 connected to node 830 and the gate of transistor connected to node 816. The current through transistor 836 is equal to the current through transistor 808. The current through transistor 844 is substantially four times the current through transistor 806, since the transistor 844 is four times the size of transistor 806. Similarly, the current through transistors 848 and 850 is also four times the current through the transistors 820, 818 and 814.

There is provided a power-down p-channel transistor 860 that is connected between nodes 830 and $V_{DD}$ node 822 which has the gate thereof connected to a PDN-Bar signal that is high during normal operation. A p-channel transistor 862 is connected between node 824 and node 816 with the gate thereof connected to the power-down signal, PDN, which is low during normal operation, and transistor 862 will therefore conduct and connect node 824 to node 816. A p-channel power down transistor 864 is connected between node 824 and node 822 with the PDN-Bar signal connected to the gate thereof such that it is off during normal operation.

Figure 9:
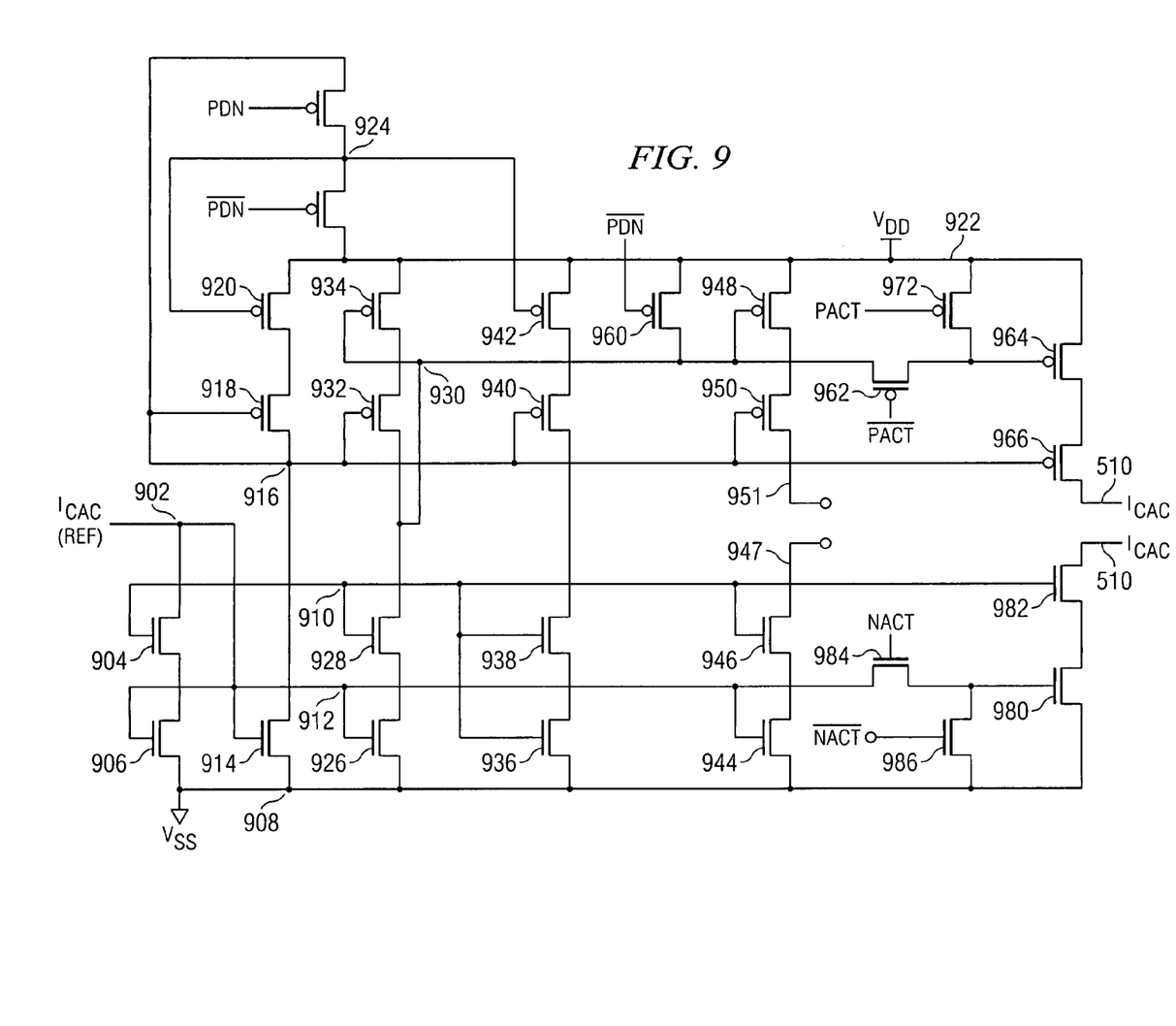
FIG. 9 illustrates a schematic diagram for the current accurate current mirror circuit.

Referring now to FIG. 9, there is illustrated a detailed schematic of a current mirror circuit utilized with the current accurate current sources 310 and 312. A reference accurate current source is received on a node 902 from the node 430 of the current source of FIG. 4a for mirroring thereof. Node 902 is connected to one side of an n-channel transistor 904, the other side thereof connected to one side of an n-channel transistor 906, the other side there of connected to $V_{SS}$ on a node 908. (It will be noted herein that the sides of a transistor, whether it is a p-channel transistor or an n-channel transistor, refer to either side of the source/drain path thereof.) The gate of transistor 904 is connected to a node 910 and the gate of transistor 906 is connected to a node 912. The current through transistors 904 and 906 is, for description herein, normalized to a value of "1." An n-channel transistor 914 is connected between the $V_{SS}$ node 908 and a node 916. Node 916 is connected to one side of a p-channel transistor 918, the other side thereof connected to one side of a p-channel transistor 920, the other side thereof connected to a $V_{DD}$ node 922. The gate of transistor 918 is connected to node 916 and the gate of transistor 920 is connected to a node 924. The current through transistor 914 is twice the current through transistor 906, as the size of transistor 914 is twice the size of transistor 906.

An n-channel transistor 926 has one side thereof connected to node 908 and the other side thereof connected to one side of an n-channel transistor 928, the other side thereof connected to a node 930. Node 930 is connected to one side of a p-channel transistor 932, the other side thereof connected to one side of p-channel transistor 934, the other side of transistor 934 connected to the $V_{DD}$ node 922. The gate of transistor 926 is connected to node 912, the gate of transistor 928 is connected to node 910, the gate of transistor 932 is connected to node 916 and the gate of transistor 934 is connected to node 930. The current through transistor 926 is the same as the current through transistor 906.

An n-channel transistor 936 has one side thereof connected to node 908 and the other side thereof connected to one side of an n-channel transistor 938, the other side of transistor 938 connected to one side of a p-channel transistor 940, the other side of p-channel transistor 940 connected to one side of a p-channel transistor 942, and the other side of p-channel transistor 942 connected to the $V_{DD}$ node 922. The gates of transistors 936 and 938 are connected to node 910, the gate of transistor 940 is connected to node 916 and the gate of transistor 942 is connected to node 924. Two cascode n-channel transistors 944 and 946 are connected in series with the one side of transistor 944 connected to node 908 and the other side of transistor 846 is connected to a node 947 to provide an output current. The gate of transistor 944 is connected to node 912 and the gate of transistor 946 is connected to node 910. Similarly, an output current is provided by two series connected cascode p-channel transistors 948 and 950 connected in series between node 922 and a node 951, with the gate of transistor 948 connected to node 930 and the gate of transistor connected to node 916. The current through transistor 936 is equal to the current through transistor 938. The current through transistor 944 is substantially the same as the current through transistor 946. Similarly, the current through transistors 948 and 950 is also the same as the current through the transistors 920, 918 and 914.

There is provided a power-down p-channel transistor 960 that is connected between nodes 930 and $V_{DD}$ node 922 which has the gate thereof connected to a PDN-Bar signal that is high during normal operation. A p-channel transistor 962 is connected between node 924 and node 916 with the gate thereof connected to the power-down signal, PDN, which is low during normal operation, and transistor 962 will therefore conduct and connect node 924 to node 916. A p-channel power down transistor 964 is connected between node 924 and node 922 with the PDN-Bar signal connected to the gate thereof such that it is off during normal operation.

The above circuitry is substantially the same as the embodiment of FIG. 8, with the difference being the circuitry associated with the switches 512 and 514, which are integral thereto. These are facilitated with a series p-channel transistor 962, that is connected between node 930 and the gate of a p-channel transistor 964, which is connected between the $V_{DD}$ node 922 and one side of the p-channel transistor 966, the other side thereof connected to the output node 510. The gate of transistor 966 is connected to the node 916. A p-channel transistor 972 is connected between the gate of transistor 964 and the $V_{DD}$ node 922, the gate thereof connected to the control signal PACT, which is high when current is to be passed through transistors 964 and 966, and the gate of transistor 962 connected to the inverse thereof, such that gate 962 conducts when current is to be passed through transistors 964 and 966. On the opposite side of the current source, that associated with the current source 312, there are provided two cascode n-channel transistors 980 and 982 connected in series between the node 510 and the $V_{SS}$ node 908. The gate of transistor 980, the lower transistor, is connected to one side of a series n-channel transistor 984, the other side thereof connected to the node 912. An n-channel transistor 986 is connected between the gate of transistor 980 and ground. The gate of transistor 986 is connected to the control signal NACT-Bar, which is low when current is being sinked through transistors 980 and 982. The gate of transistor 984 is connected to the control signal NACT which is high during current sinking. The size of transistors 980, 982, 964 and 966 is substantially four times the size of transistor 906, such that substantially four times the current passes there through.

Figure 10:
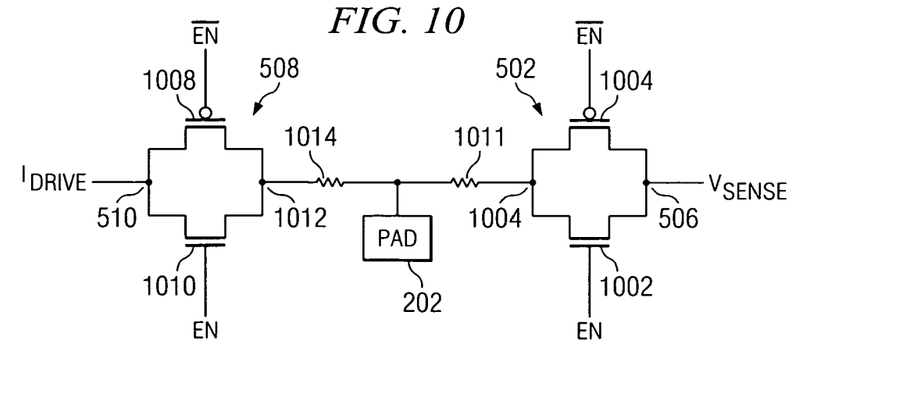
FIG. 10 illustrates a schematic diagram of the slave switches.

Referring now to FIG. 10, there is illustrated a schematic diagram of the enable switches 502 and 508. The switch 502 is comprised of two parallel connected transistors, an n-channel transistor 1002 and a p-channel transistor 1004, connected between node 506 and intermediate node 1004. A resistor 1011 is connected between node 1004 and the pad 202. The gate of p-channel transistor 1004 is connected to an enable signal EN-Bar, and the gate of transistor 1002 is connected to an enable signal, EN. The switch 508 is comprised of two parallel connected transistors, a p-channel transistor 1008 and an n-channel transistor 1010 connected in parallel between node 510 and an intermediate node 1012. A resistor 1014 is connected between node 1012 and the pad 202. Resistors 1011 and 1014 are resistors with a fairly small resistance such as 500 ohms. The gate of transistor 1008 is connected to the EN-Bar signal and the gate of transistor 1010 is connected to the EN signal. This configuration of separate drive and sense switches makes measurement insensitive to switch resistance.

Figure 11:
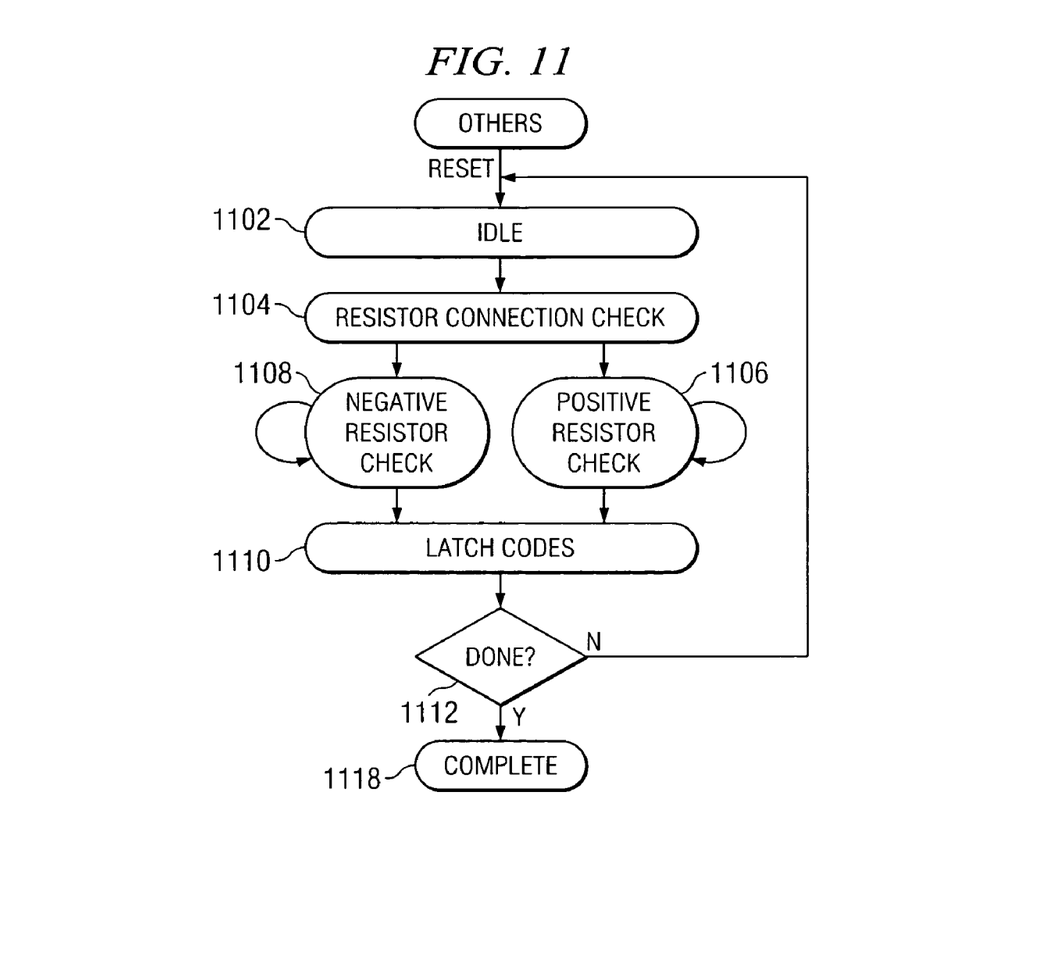
FIG. 11 illustrates a state diagram of the overall operation.

Referring now to FIG. 11, there is illustrated a state diagram for the operation of the resistor determination and determination of program codes. The state diagram initially resets to an idle state 1102, which idle state is set whenever a reset is asserted, and this state is exited whenever the "supervisor" starts the operation of determining code. Once the reset is unasserted, the state diagram will flow to a state 1104 to perform a resistor connection check. This state determines which side the resistor is connected to, i.e., $V_{DD}$ or ground. Depending upon which side it is connected to, the state diagram will flow to either a state 1106 to perform a positive resistor check, or to a state 1108 to perform a negative resistor check. In the positive resistor check state, indicating that the resistor connection check state 1104 had determined that the resistor was connected to $V_{DD}$, the binary value for the resistor $R_{KNOWN}$ is incremented from the lowest value to the highest value until an equality on the output of the comparator 212 is reached. When the equality is reached, this constitutes the decoded value of the resistor 114. When this decoded value is reached, the state diagram flows to a state 1110 to latch the decoded code for each pad having an external program resistor associated therewith. This is latched into a memory location as part of a control word. The negative resistor check state 1108 operates similar to the positive resistor check state 1106. Once a particular code is latched, a determination is made in a decision block 1112 as to whether all pads have been decoded. If not, the state diagram flows back to the idle state 1102 to go to the next pad. When all pads are done, the state diagram flows to a state 1118, which is the terminal state of the state machine. This state is only exited after another hardware reset.

Figure 12:
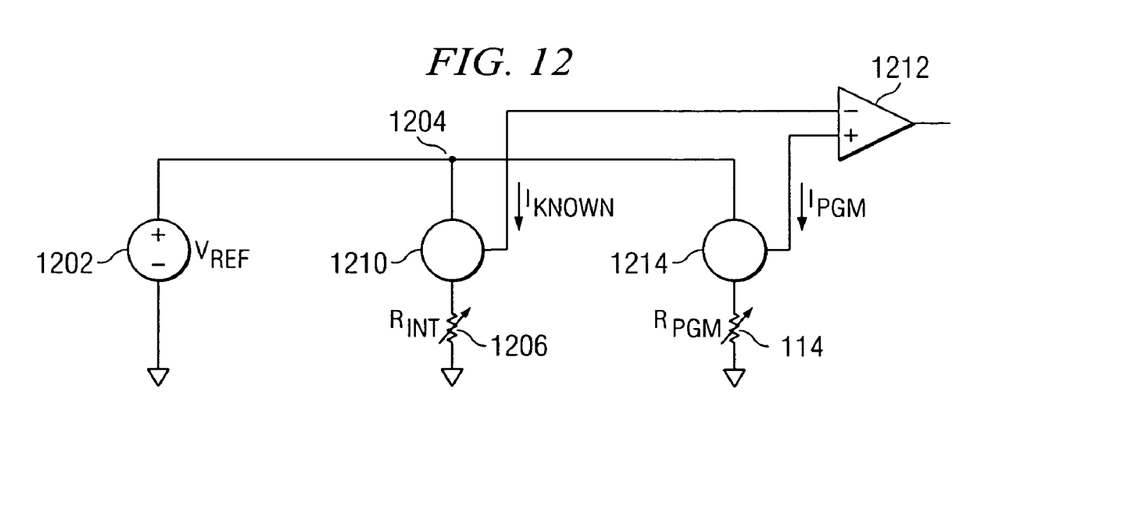
FIG. 12 illustrates an alternate embodiment for determining the value of the program resistor.

Referring now to FIG. 12, there is illustrated an alternate embodiment for determining the value of the program resistor 114. In the above-described embodiment, the voltage across either the internal resistor or the program resistor is measured with a "forced" current of approximately 100 microamps in the above described embodiment. Thus, by forcing a known current through both an internal resistor and the program resistor, the two voltages resulting therefrom can be compared. In the alternate embodiment, the voltage is forced across the program resistor and the internal resistor and then the current there through measured, this voltage being a constant voltage. Thus, when the internal resistor is varied, the current there through will vary. By comparing the resultant currents, the internal resistor can be varied in a quantized manner to determine a code value associated with the discreet value of the external program resistor.

Referring further to FIG. 12, there is provided a voltage source 1202 that provides a constant voltage $V_{REF}$. This voltage $V_{REF}$ is a voltage that is preferably process and temperature independent. This, as described above, can be generated with the internal band gap generator. This voltage is pressed on a node 1204. The voltage on node 1204 is disposed across an internal resistor 1206, which is variable. The voltage on node 1204 is also then impressed across the resistor program resistor 114, which program resistor 114 is disposed between the node 1204 and ground. Similarly, the internal resistor 1206 is disposed between the internal node and ground. This is for the condition wherein the external resistor is connected between the pad and ground, the pad connected to node 1204.

The current through resistor 1206 is measured with a current measurement device 1210. This current is converted to voltage with a current-to-voltage converter (not shown) and input to the negative input of a comparator 1212. Similarly, a current measurement device 1214 is provided for measuring a current through the resistor 114 to ground and this converted to a voltage for input to the positive input of the comparator 1212. The comparator 1212 determines the difference in currents.

For the operation wherein the program resistor 114 is connected between $V_{DD}$ and the node 1204, the voltage reference 102 provides a constant voltage on the node 1204, with the exception that current flows into the positive input of the reference voltage 1202 instead of sourcing current to the node 1204.

Although the preferred embodiment has been described in detail, it should be understood that various changes, substitutions and alterations can be made therein without departing from the spirit and scope of the invention as defined by the appended claims.

What is claimed is:

1. An integrated circuit with external programming capabilities, comprising:
   a pin current source for interfacing with at least one pin on the integrated circuit to control current flow there through to an external load interfaced to the at least one pin external to the integrated circuit, which external load has at least two discrete values;
   a voltage detector for detecting the voltage on the at least one pin;
   a state detector for comparing the voltage on the at least one pin to at least two discrete voltage thresholds, each associated with a separate value of a control word, and determining the value associated with the detected voltage; and
   said state detector outputting the determined value of the control word.

2. The integrated circuit of claim 1, wherein said pin current source is a constant current source.

3. The integrated circuit of claim 2, wherein said pin current source provides a current that is independent of process variations utilized to manufacture the integrated circuit.

4. The integrated circuit of claim 2, wherein said pin current source provides a current that is independent of temperature variations.

5. The integrated circuit of claim 1, wherein said pin current source sources current from a supply voltage to the at least one pin and the external load is disposed between the at least one pin and a reference voltage lower than the supply voltage.

6. The integrated circuit of claim 1, wherein said pin current source sinks current to a reference voltage lower than a supply voltage and the external load is disposed between the at least one pin and the supply voltage.

7. The integrated circuit of claim 1, wherein said state detector comprises:
   a comparator for comparing said detected voltage with an internal reference voltage as a compare threshold;
   an internal reference voltage generator for generating said internal reference voltage;
   said internal reference voltage being variable; and
   a controller for varying the value of said reference voltage in discrete steps, each correlating with one of said at least two discrete voltage thresholds, with each of said discrete steps correlated to one of said values of said control word, such that a true compare by said comparator will comprise a determination that said detected voltage corresponds to said associated value of said control word.

8. The integrated circuit of claim 7, wherein said internal reference voltage generator comprises:
   an internal load connected between an internal node and an internal reference;
   a reference current source for interfacing with said internal load and controlling the flow of current there through to thereby control the voltage on said internal node;
   the voltage on said internal node comprising said internal reference voltage; and
   said internal load having a variable value that can be varied by said controller.

9. An integrated circuit having a plurality of interface pins, with external programming functionality associated with at least one of the pins to enable input of program information thereto through the at least one of the pins, comprising:
   a primary current source for interfacing with the at least one of the pins to control current flow there through to an external load interfaced to the at least one of the pins, which external load has a plurality of possible discrete values, such that a program voltage is impressed there across and which program voltage for each discrete value of the external load has an associated possible discrete program voltage value;
   a comparator having a primary voltage input interfaced to receive the program voltage and a reference voltage input, said comparator operable to compare the program voltage on the primary voltage input to an internal reference voltage on the reference voltage input, the internal reference voltage having a plurality of possible discrete reference voltage values, each possible discrete reference voltage value associated with each possible discrete program voltage value, each discrete reference voltage value having associated therewith a separate value of a control word;
   a reference voltage generator for generating the possible discrete reference voltage values;
   a controller for selectively applying different ones of the possible discrete reference voltage values generated by said reference voltage generator to the reference voltage input of said comparator, said controller determining as a final value of the reference voltage input when the output of said comparator indicates that the one of the applied different ones of the possible discrete reference voltage values corresponding to the input program voltage value on the at least one of the pins is input to the reference voltage input of said comparator; and
   said controller outputting the value of the control word associated with the determined final value of the one of the applied different ones of the possible discrete reference voltage values to the reference voltage input.

10. The integrated circuit of claim 9, wherein said primary current source is a constant current source.

11. The integrated circuit of claim 10, wherein said primary current source provides a current that is independent of process variations utilized to manufacture the integrated circuit.

12. The integrated circuit of claim 10, wherein said primary current source provides a current that is independent of temperature variations.

13. The integrated circuit of claim 9, wherein said primary current source sources current from a supply voltage to the at least one pin and the external load is disposed between the at least one pin and a reference voltage lower than the supply voltage.

14. The integrated circuit of claim 9, wherein said primary current source sinks current to a reference voltage lower than a supply voltage and the external load is disposed between the at least one pin and the supply voltage.

15. The integrated circuit of claim 9, wherein said reference voltage generator comprises:
   an internal load connected between an internal node and an internal reference;
   a reference current source for interfacing with said internal load and controlling the flow of current there through and the voltage on said internal node;
   the voltage on said internal node comprising said internal reference voltage; and
   said internal load having a variable value that can be varied by said controller.

16. The integrated circuit of claim 9, wherein said primary current source comprises a current accurate current that supplies a constant current to the at least one pin that is proportional to the ratio of a base internal reference voltage and an off-chip reference resistor.

17. The integrated circuit of claim 16, wherein said off-chip reference resistor has temperature parameters substantially similar to the temperature parameters of said external load.

18. The integrated circuit of claim 16, wherein said reference current source delivers a voltage accurate current to the reference voltage input of said comparator, said voltage accurate current being proportional to the ratio of said base internal reference voltage and an internal reference resistor, and which provides a constant voltage across said internal reference resistor.

19. The integrated circuit of claim 18, wherein said internal reference resistor has temperature parameters substantially similar to the temperature parameters of said internal load.

20. An integrated circuit with external programming capabilities, comprising:
a pin driver for driving at least one pin on the integrated circuit, said pin driver having:
a first pin current source for sourcing current from a supply voltage source to the at least one pin and to a first external load, when the at least one external load is disposed between the at least one pin and a ground reference voltage, which first external load has at least two discrete values, and
a second pin current source for sinking current from the at least one pin and a second external load to the ground reference voltage when the second external load is disposed between the at least one pin and the supply voltage source, which second external load has at least two discrete values;
a voltage detector for detecting the voltage on the at least one pin;
a state detector for comparing the voltage on the at least one pin to at least two discrete voltage thresholds for each of the first and second external loads, depending upon which of the first and second external loads is interfaced with the at least one pin, each of said discrete thresholds for each of the first and second external loads associated with a separate value of a control word, said state detector operable to determine the value of the control word associated with the detected voltage; and
said state detector outputting the determined value of the control word.

21. The integrated circuit of claim 20, wherein said state detector includes:
a comparator for comparing said detected voltage with an internal reference voltage as a compare threshold;
an internal reference voltage generator for generating said internal reference voltage;
said internal reference voltage variable; and
a controller for varying the value of said reference voltage in discrete steps, each correlating with one of said discrete voltage thresholds, with each of said discrete steps correlated to one of said values of said control word, such that a true compare by said comparator will comprise a determination that said detected voltage corresponds to said associated value of said control word.

22. The integrated circuit of claim 21, wherein said state detector further includes:
a polarity detector for detecting which of the first and second external loads is interfaced with the at least one pin; and
a primary multiplexer for connecting said first pin current source to the at least one pin if the first external load is interfaced to the at least one pin, and connecting said second pin current source to the at least one pin if the second external load is interfaced to the at least one pin.

23. The integrated circuit of claim 22, wherein said polarity detector comprises a control circuit that connects either said first or second pin current source to the at least one pin with said primary multiplexer and determining if current flows, which will occur only when the respective one of the first or second external loads is interfaced to the at least one pin, and the lack of current flow indicating that the other of the respective first or second external loads is interfaced to the at least one pin.

24. The integrated circuit of claim 22, wherein said internal reference voltage generator comprises:
a first internal load connectable between a first internal node and the ground reference voltage;
a second internal load connectable between said internal node and the supply reference voltage, said first and second internal loads variable; and
an internal node driver for sourcing current to or sinking current from said internal node, including:
a first reference current source for sourcing current to said first internal load from the supply voltage source,
a second reference current source for sinking current from said second internal load to the ground reference voltage,
an internal multiplexer for selecting said first reference current source when said primary multiplexer selects said first pin current source, and said second reference current source when said primary multiplexer selects said second pin current source, and
said controller controlling the flow of current through the respectively connected one of said first or second reference current sources by varying the value of the respective first and second internal loads and thereby the voltage on said internal node;
the voltage on said internal node comprising said internal reference voltage.

25. A method for programming an integrated circuit using at least one pin on the integrated circuit, comprising the steps of:
driving the at least one pin with a pin current source to control current flow there through to an external load that is interfaced to the at least one pin external to the integrated circuit, which external load has at least two discrete values;
detecting the voltage on the at least one pin with a voltage detector;
comparing the voltage on the at least one pin to at least two discrete voltage thresholds, each associated with a separate value of a control word, and determining the value associated with the detected voltage; and
outputting the determined value of the control word.

26. The method of claim 25, wherein the step of driving the at least one pin with the pin current source comprises driving the at least one pin with a constant current source.

27. The method of claim 26, wherein the pin current source provides a current that is independent of process variations utilized to manufacture the integrated circuit.

28. The method of claim 27, wherein the pin current source provides a current that is independent of temperature variations.

29. The method of claim 25, wherein the step of driving the at least one pin with the pin current source sources current from a supply voltage to the at least one pin, and the external load is disposed between the at least one pin and a reference voltage lower than the supply voltage.

30. The method of claim 25, wherein the step of driving the at least one pin with the pin current source sinks current to a reference voltage lower than a supply voltage and the external load is disposed between the at least one pin and the supply voltage.

31. The method of claim 25, wherein said state detector comprises:
comparing the detected voltage with an internal reference voltage as a compare threshold;
generating the internal reference voltage with an internal reference voltage generator;

the internal reference voltage variable; and varying the value of the reference voltage in discrete steps, each correlating with one of the discrete voltage thresholds, with each of the discrete steps correlated to one of the values of the control word, such that a true compare by the step of comparing will comprise a determination that the detected voltage corresponds to the associated value of the control word.

32. The method of claim 31, wherein the step of generating the internal reference voltage includes the steps of:

connecting an internal load between an internal node and an internal reference;

driving the internal load with a reference current source and controlling the flow of current there through to thereby control the voltage on the internal node;

the voltage on the internal node comprising the internal reference voltage; and the internal load having a variable value that can be varied by the step of varying.

33. A method for enabling external programming of an integrated circuit through at least one pin of a plurality of interface pins associated therewith, comprising the steps of:

driving at least one pin on the integrated circuit with a pin driver, the step of driving including:

sourcing current from a supply voltage source to the at least one pin and to a first external load with a first pin current source, when the at least one external load is disposed between the at least one pin and a supply reference voltage, which first external load has at least two discrete values, and sinking current from the at least one pin and a second external load to the supply reference voltage with a second pin current source, when the second external load is disposed between the at least one pin and the supply voltage source, which second external load has at least two discrete values;

detecting the voltage on the at least one pin with a voltage detector;

comparing the voltage on the at least one pin to at least two discrete voltage thresholds for each of the first and second external loads, depending upon which of the first and second external loads is interfaced with the at least one pin, each of the discrete thresholds for each of the first and second external loads associated with a separate value of a control word, the step of comparing operable to determine the value of the control word associated with the detected voltage; and outputting the determined value of the control word.

34. The method of claim 33, wherein step of comparing includes the steps of:

comparing with a comparator the detected voltage with an internal reference voltage as a compare threshold;

generating the internal reference voltage with an internal reference voltage generator, the internal reference voltage variable; and varying with a controller the value of the internal reference voltage in discrete steps, each correlating with one of the discrete voltage thresholds, with each of the discrete steps correlated to one of the values of the control word, such that a true compare by the comparator will comprise a determination that the detected voltage corresponds to the associated value of the control word.

35. The method of claim 34, wherein the step of comparing with the comparator further includes:

detecting with a polarity detector which of the first and second external loads is interfaced with the at least one pin; and multiplexing with a primary multiplexer the sourcing and sinking steps with the step of driving to connect the first pin current source to the at least one pin if the first external load is interfaced to the at least one pin, and connect the second pin current source to the at least one pin if the second external load is interfaced to the at least one pin.

* * * * *